United States Patent
Wei et al.

(10) Patent No.: US 11,393,712 B2
(45) Date of Patent: Jul. 19, 2022

(54) SILICON ON INSULATOR STRUCTURE AND METHOD OF MAKING THE SAME

(71) Applicants: Zing Semiconductor Corporation, Shanghai (CN); SHANGHAI INSTITUTE OF MICROSYSTEM AND INFORMATION TECHNOLOGY, CHINESE ACADEMY OF SCIENCES, Shanghai (CN)

(72) Inventors: Xing Wei, Shanghai (CN); Nan Gao, Shanghai (CN); Zhongying Xue, Shanghai (CN)

(73) Assignees: Zing Semiconductor Corporation, Shanghai (CN); SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 17/191,683

(22) Filed: Mar. 3, 2021

(65) Prior Publication Data
US 2022/0181200 A1    Jun. 9, 2022

(30) Foreign Application Priority Data
Dec. 8, 2020    (CN) .......................... 202011443228.X

(51) Int. Cl.
*H01L 21/762*    (2006.01)
*H01L 21/322*    (2006.01)

(52) U.S. Cl.
CPC .... *H01L 21/76254* (2013.01); *H01L 21/3226* (2013.01); *H01L 21/76251* (2013.01)

(58) Field of Classification Search
CPC ......... H01L 21/76254; H01L 21/76251; H01L 21/7806; H01L 21/3226
See application file for complete search history.

(56) References Cited

U.S. PATENT DOCUMENTS

| | | | | |
|---|---|---|---|---|
| 5,374,564 A * | 12/1994 | Bruel | ..................... | G01L 9/0042 438/455 |
| 5,882,987 A * | 3/1999 | Srikrishnan | ....... | H01L 21/76254 438/455 |
| 6,323,108 B1 * | 11/2001 | Kub | .................. | H01L 21/76254 438/459 |
| 7,514,341 B2 * | 4/2009 | Neyret | .............. | H01L 21/76254 438/455 |
| 2002/0174828 A1 * | 11/2002 | Vasat | ...................... | C30B 29/06 117/90 |

(Continued)

*Primary Examiner* — Mohsen Ahmadi
(74) *Attorney, Agent, or Firm* — Chen Yoshimura LLP

(57) ABSTRACT

The present invention provides a method of making a silicon on insulator (SOI) structure, comprising steps of: providing a bonded structure, the bonded structure comprises a first substrate, a second substrate and an insulating buried layer, the insulating buried layer is positioned between the first substrate and the second substrate; peeling off a layer of removing region of the first substrate from the bonded structure to obtain a SOI structure; and processing the SOI structure with isothermal annealing technology at a pressure which is lower than atmospheric pressure.

10 Claims, 3 Drawing Sheets

(56) References Cited

U.S. PATENT DOCUMENTS

| | | | |
|---|---|---|---|
| 2007/0045738 A1* | 3/2007 | Jones | H01L 21/76254 438/455 |
| 2010/0176495 A1* | 7/2010 | Chu | H01L 21/76254 257/E23.008 |
| 2012/0238070 A1* | 9/2012 | Libbert | H01L 21/76251 438/455 |
| 2018/0211889 A1* | 7/2018 | Kayser | H01L 22/10 |
| 2019/0378753 A1* | 12/2019 | Samanta | H01L 21/76254 |

* cited by examiner

SILICON ON INSULATOR STRUCTURE AND METHOD OF MAKING THE SAME

FIELD OF THE INVENTION

The present invention generally relates to a semiconductor manufacturing technology field, and specifically, relates to a silicon on insulator (SOI) structure and method of making the same.

BACKGROUND OF THE INVENTION

Silicon-On-Insulator (SOI) is formed by an insulating buried layer positioned between a top-layer silicon and a substrate, and it means silicon transistors are formed above insulator by interposing insulation material between the silicon transistors. Then, parasitic capacitors therebetween may be cut to a half. Advantages of SOI materials are: achieving medium isolation of devices in an integrated circuit to eliminate parasitic latch-up effect in bulk silicon CMOS circuit thoroughly; and low parasitic capacitance, high integrated density, high speed, simple process, low short-channel effect and prone to low-voltage low-power-consumption application for an integrated circuit made with such materials. Further, SOI materials are used to make MEMS light switch with bulk micromachining technology. For SOI materials, uniformity of the top-layer silicon is a key parameter which affect greatly on performance of devices.

During SOI process, chemical mechanical polishing (CMP) is commonly used to planarize the top-layer silicon. However, current CMP cannot fulfill the required uniformity of the top-layer silicon.

To solve this problem, high-temperature atmospheric-pressure annealing technology is performed to planarize a surface of the top-layer silicon. Compared with CMP technology, it promotes uniformity of the top-layer silicon, but accompanied with sliplines. Decreasing annealing temperature may decline the number of the sliplines, but planarization of the top-layer silicon may be deteriorated.

SUMMARY OF THE INVENTION

In the summary of the invention, a series of concepts in a simplified form is introduced, which will be described in further detail in the detailed description. This summary of the present invention does not intend to limit the key elements or the essential technical features of the claimed technical solutions, nor intend to limit the scope of the claimed technical solution.

The present invention provides a silicon on insulator (SOI) structure and method of making the same to reduce number of sliplines without affecting planarization of the top-layer silicon.

To solve one of above-mentioned problems, an aspect of the invention is to provide a method of making a silicon on insulator, comprising steps of: providing a bonded structure, the bonded structure comprising a first substrate, a second substrate and an insulating buried layer, and the insulating buried layer being positioned between the first substrate and the second substrate; peeling off a layer of removing region of the first substrate from the bonded structure to obtain a SOI structure; and processing the SOI structure with isothermal annealing technology at a pressure which is lower than atmospheric pressure.

In accordance with some embodiments, optionally, the pressure for the isothermal annealing technology may be no greater than 100 torr.

In accordance with some embodiments, optionally, the method may further comprise a temperature rising step performed before applying the isothermal annealing technology and a temperature falling step performed after applying the isothermal annealing technology, and both the temperature rising step and the temperature falling step may be performed at a pressure which is no greater than 100 torr.

In accordance with some embodiments, optionally, a range of an annealing temperature for the isothermal annealing may be 1190° C.~1230° C., and annealing time for the isothermal annealing may be no greater than 300 sec.

In accordance with some embodiments, optionally, an atmosphere for the isothermal annealing technology may comprise hydrogen gas, argon gas or mixture of hydrogen gas and argon gas, and gas flow rate may be 40 slm~120 slm.

In accordance with some embodiments, optionally, the bonded structure may be formed with steps comprises: providing the first substrate and the second substrate; growing a first oxide layer on a front surface of the first substrate; performing ion implantation from the front surface of the first substrate toward the first substrate to obtain a damaged layer; bonding the front surface of the first substrate and a front surface of the second substrate to form the bonded structure.

In accordance with some embodiments, optionally, when thickness of the insulating buried layer is smaller than 4000 Å, the insulating buried layer may comprise a first oxide layer. When thickness of the insulating buried layer is greater than 4000 Å, the insulating buried layer may comprise a first oxide layer and a second oxide layer, and during the growth of the first oxide layer on the front surface of the first substrate, the second oxide layer may be formed on the front surface of the second substrate.

In accordance with some embodiments, optionally, thickness of the first oxide layer may be 100 Å~4000 Å, and thickness of the second oxide layer may be 100 Å~30000 Å.

In accordance with some embodiments, optionally, the method may comprise: performing a first annealing for the bonded structure, peeling off the bonded structure along with the damaged layer, and obtain a first film structure constructed on the insulating buried layer, wherein the SOI structure is constructed by the second substrate, the insulating buried layer and the first film; performing a second annealing for the SOI structure; and rinsing a surface of the first film.

In accordance with some embodiments, optionally, the second annealing may be performed in oxygen-containing atmosphere, and a layer of silicon oxide may be grown on the surface of the first film; and the rinsing step may be used to remove the layer of silicon oxide.

Another aspect of the invention is to provide a SOI structure, made with the method mentioned above.

Effects compared with current technology are addressed here: the present invention provides a method of making a silicon on insulator (SOI) structure, comprising steps of: providing a bonded structure, the bonded structure comprising the first substrate, the second substrate and the insulating buried layer, and the insulating buried layer being positioned between the first substrate and the second substrate; peeling off a layer of removing region of the first substrate from the bonded structure to obtain a SOI structure; and processing the SOI structure with isothermal annealing technology at a pressure which is lower than atmospheric pressure. Through processing with the isothermal annealing technology at the pressure which is lower than atmospheric pressure, the number of sliplines may be reduced effectively without affecting planarization of the top-layer silicon.

Further, the SOI structure may undergo a temperature rising step performed before applying the isothermal annealing technology and a temperature falling step performed after applying the isothermal annealing technology, both of which may be performed at a pressure which is no greater than 100 torr, to reduce the number of sliplines to a greater extent.

BRIEF DESCRIPTION OF THE DRAWINGS

Various objects and advantages of the present invention will be more readily understood from the following detailed description when read in conjunction with the appended drawing, in which.

DESCRIPTION OF EMBODIMENTS OF THE INVENTION

Figure 1:
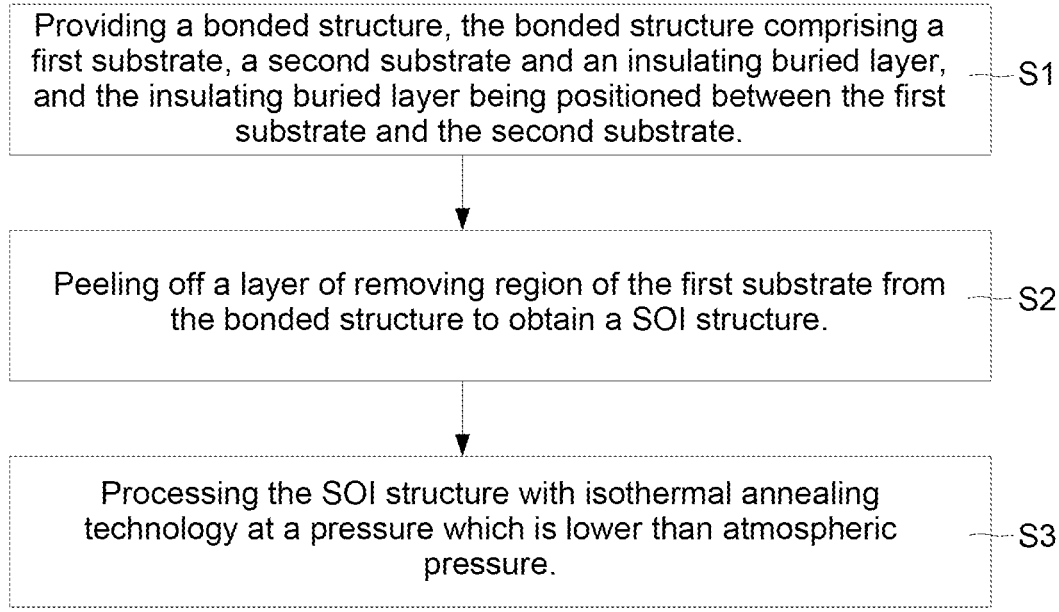
FIG. 1 shows a flow chart of a method of making a silicon on insulator (SOI) structure according to an embodiment of the invention.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

For a thorough understanding of the present invention, the detailed steps will be set forth in detail in the following description in order to explain the technical solution of the present invention. The preferred embodiments of the present invention is described in detail as follows, however, in addition to the detailed description, the present invention also may have other embodiments.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

FIG. 1 shows a flow chart of a method of making a silicon on insulator (SOI) structure according to an embodiment of the invention. As shown in FIG. 1, a method of making a silicon on insulator may comprise steps of: Step S1: providing a bonded structure, wherein the bonded structure comprises a first substrate, a second substrate and an insulating buried layer, the insulating buried layer is positioned between the first substrate and the second substrate; Step S2: peeling off a layer of removing region of the first substrate from the bonded structure to obtain a first film; Step S3: processing the SOI structure with isothermal annealing technology at a pressure which is lower than atmospheric pressure.

Figure 2A:
FIGS. 2A~2G show cross-sectional views of a structure at each step of a method of making a SOI structure according to an embodiment of the invention.
Figure 2B:
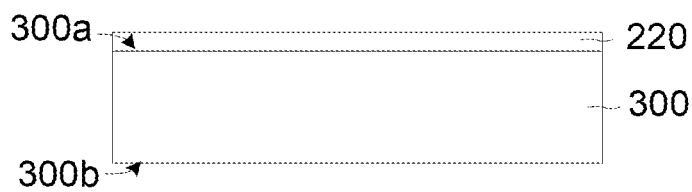
Figure 2C:
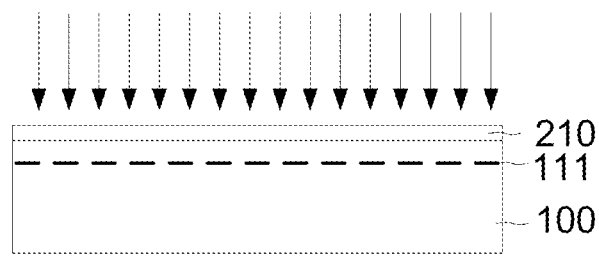
Figure 2D:
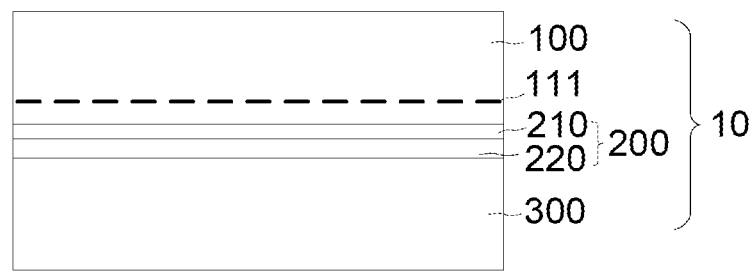

Referring to FIGS. 1 and 2A~2G to know further details of the method of making a SOI structure according to the present embodiment of the invention. FIG. 2A shows a cross-sectional view of the first substrate in the present embodiment. FIG. 2B shows a cross-sectional view of the second substrate in the present embodiment. FIG. 2C shows a cross-sectional view of the bonded structure after performing ion implantation in the present embodiment. FIG. 2D shows a cross-sectional view of the bonded structure in the present embodiment.

As shown in FIGS. 2A~2D, at first, Step S1 is performed to provide a bonded structure 10. The bonded structure 10 comprises the first substrate 100, the second substrate 300 and the insulating buried layer 200. The insulating buried layer 200 and the first substrate 100 are layered in order above the second substrate 300, i.e. the insulating buried layer 200 is positioned between the first substrate 100 and the second substrate 300.

The present step may comprise the following steps. As shown in FIGS. 2A and 2B, at first, the first substrate 100 and the second substrate 300 are provided. The first substrate 100 and the second substrate 300 may be bare substrate for example, and specifically, the first substrate 100 and the second substrate 300 may be bare silicon substrate; preferably, the shape of the first substrate 100 is identical to the shape of the second substrate 300, and the size of the first substrate 100 is identical to the size of the second substrate 300. The first substrate 100 may comprise a front surface 100a and a back surface 100b opposite to the front surface 100a; the second substrate 300 may comprise a front surface 300a and a back surface 300b opposite to the front surface 300a.

Then, when thickness of the insulating buried layer 200 is smaller than 4000 Å, the insulating buried layer 200 may only comprise a first oxide layer 210. At this time, the first oxide layer 210 may be grown on the front surface 100a of the first substrate, thickness of the first oxide layer 210 may be 100 Å~4000 Å for example, and the thickness of the insulating buried layer 200 is the thickness of the first oxide layer 210.

When the thickness of the insulating buried layer 200 is greater than 4000 Å, the insulating buried layer 200 may comprise the first oxide layer 210 and a second oxide layer 220, and at this time, the first oxide layer 210 may be grown on the front surface of the first substrate 100, and the thickness of the first oxide layer 210 may be 100 Å~4000 Å for example; meanwhile, the second oxide layer 210 may be grown on the front surface of the second substrate 300, and the thickness of the second oxide layer 210 may be 100 Å~30000 Å for example. The thickness of the insulating buried layer 200 may be a sum of the thickness of the first oxide layer 210 and the thickness of the second oxide layer 210. In the present embodiment, the thickness of the insulating buried layer 200 may be greater than 4000 Å, and therefore, the insulating buried layer 200 may comprise the first oxide layer 210 and the second oxide layer 220.

As shown in FIG. 2C, then, an ion implantation from the front surface of the first substrate 100 toward the first substrate 100 may be performed to obtain an ion implanted layer 111 of the first substrate 100.

In the present step, ion implantation is an important measure in semiconductor manufacturing technology to dope dopants in a semiconductor easily, especially at required position and depth. Besides, with ion implantation, it is capable to control dopants precisely to provide high repeatability, which cannot be provided by other doping technology. In the present embodiment, ion implantation may be performed from the surface of the first oxide layer 210 toward the first substrate 100 to form a damaged layer at a predetermined depth of the first substrate 100, i.e. the ion implanted layer 111, and then the first film may be peeled off and transferred at the ion implanted layer 111. The depth of the ions inside the first substrate 100, i.e. transferred thickness of the first film, depends on ion energy to perform the ion implantation. Therefore, the predetermined depth may be determined considering the transferred thickness of the first film, and the ion energy may be set to enough value to allow the ions reaching the predetermined depth inside the first substrate 100. In the present embodiment, the ion energy may be set as 10 KeV~200 KeV, dose may be $5.5/cm^2$~$7.5/cm^2$.

The ion implantation may be performed with hydrogen ions, helium ions, neon ions, argon ions, krypton ions, xenon ions, radon ions, or a kind of hydrogen ions together with another ion, for example, hydrogen and helium ions. When the ion implantation is performed with hydrogen and helium ions, the order to implant hydrogen and helium ions may be varied according to requirement. In the present embodiment, the order to implant hydrogen and helium ions may be hydrogen ions first and then helium ions for example, and the implant depth of helium ions may be greater than that of hydrogen ions.

Rinsing may be required due to coproduct when forming the first oxide layer 210 and the second oxide layer 220 and particle pollution caused by ion implantation to obtain clean surface for later bonding process. Therefore, the first substrate 100 and the second substrate 300 are rinsed to clean the surfaces of the first oxide layer 210 and the second oxide layer 220.

As shown in FIG. 2D, then, a surface of the first oxide layer 210 away from the front surface of the first substrate 100 and a surface of the second oxide layer 220 away from the front surface of the second substrate 300 are bonded to bond the front surface of the first substrate 100 and the front surface of the second substrate 30 to form the bonded structure 10.

Figure 2E:
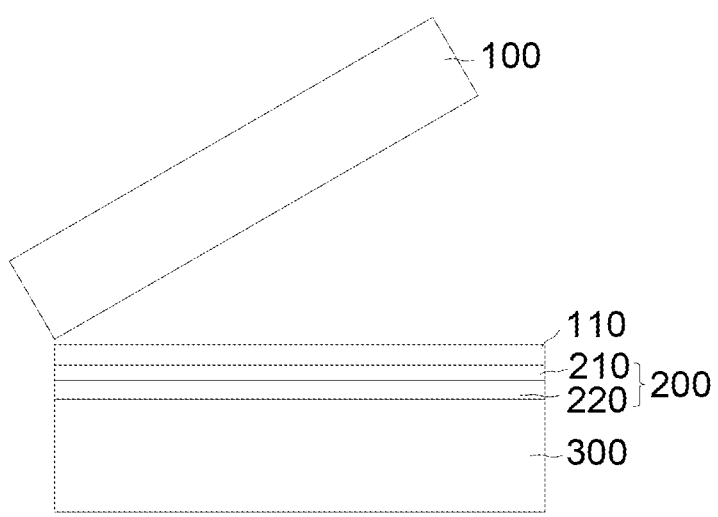
Figure 2F:
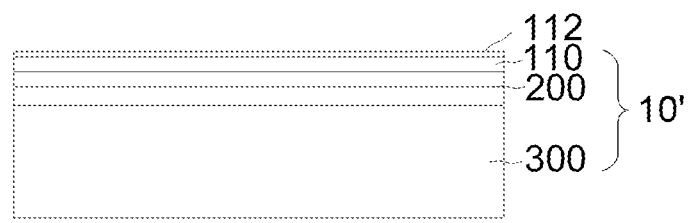

FIG. 2E shows a cross-sectional view of the SOI structure in the present embodiment. FIG. 2F shows a cross-sectional view of the SOI structure after performing a second annealing in the present embodiment.

Then, Step S2 is performed with peeling off a layer of removing region of the first substrate 100 from the bonded structure 10 to obtain a SOI structure 10'.

The present step may be specified to comprise details below. As shown in FIG. 2E, at first, a first annealing for the bonded structure 10 is performed. The bonded structure 10 is peeled off along with the ion implanted layer 111 (damaged layer) to obtain the first film 110 constructed on the insulating buried layer 200 and the after-peeling-off first substrate 100. The first film 110 contributes to a part of the thickness of the first substrate 100, and the first substrate 100 after peeling off the first film 110 may be recycled to be used as the first substrate forming the bonded structure 10 next time. Together with the second substrate 300, the insulating buried layer 200 and the first film 110, the SOI structure 10' are formed. In the present embodiment, the temperature of the first annealing may be 400° C.~600° C., and time of annealing may not exceed 30 min.

As shown in FIG. 2F, then, the second annealing for the SOI structure 10' may be performed. The second annealing may be performed in oxygen-containing atmosphere, and physical chemical reaction may be taken place at the bonding interface to significantly increase bonding intensity. The temperature of the second annealing may be lower than 1250° C. During the second annealing, because the first film 110 may be exposed to oxygen-containing atmosphere, and therefore, silicon of the first film 110 may be reacted with oxygen, and a layer of silicon oxide 112 may be grown on the surface of the first film 110.

Figure 2G:
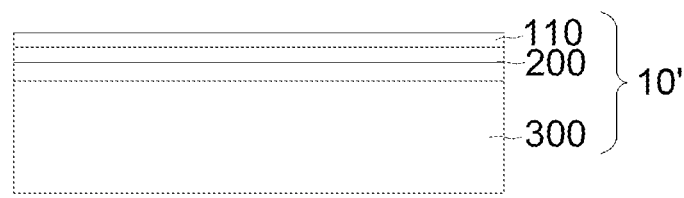

As shown in FIG. 2G, then, a rinsing step may be used to clean the first film 110 to remove the layer of silicon oxide 112.

Then Step S3 is performed through processing with the isothermal annealing technology at the pressure which is lower than atmospheric pressure. Specifically, in the RTA equipment or epitaxy equipment, the SOI structure 10' may be planarized with the isothermal annealing technology which atmosphere may comprise hydrogen gas, argon gas or mixture of hydrogen gas and argon gas, and gas flow rate is usually 40 slm~120 slm. The isothermal annealing technology is an isothermal process and an annealing temperature is 1190° C.~1230° C., such as 1190° C., 1195° C., 1200° C., 1210° C., 1215° C., 1220° C., 1230° C., etc. Annealing pressure may be no greater than 100 torr, for example, 5 torr, 6 torr, 7 torr, 8 torr, 9 torr, 10 torr, 11 torr, 12 torr, 13 torr, 14 torr, 15 torr, 18 torr, 20 torr, 30 torr, 40 torr, 50 torr, 80 torr, 90 torr, 100 torr, etc. Annealing time may be no greater than 300 sec. For high-temperature atmospheric-pressure annealing technology, because of different coefficient of thermal expansion for silicon and silicon oxide and temperature difference of the SOI structure within the equipment, sliplines occur at edge of the SOI structure. Meanwhile, the higher the annealing temperature is, the more the number of sliplines is. Therefore, the present embodiment applies the isothermal annealing technology to inhibit the generation of sliplines to reduce the number of sliplines effectively without affecting planarization of the top-layer silicon.

Figure 3:
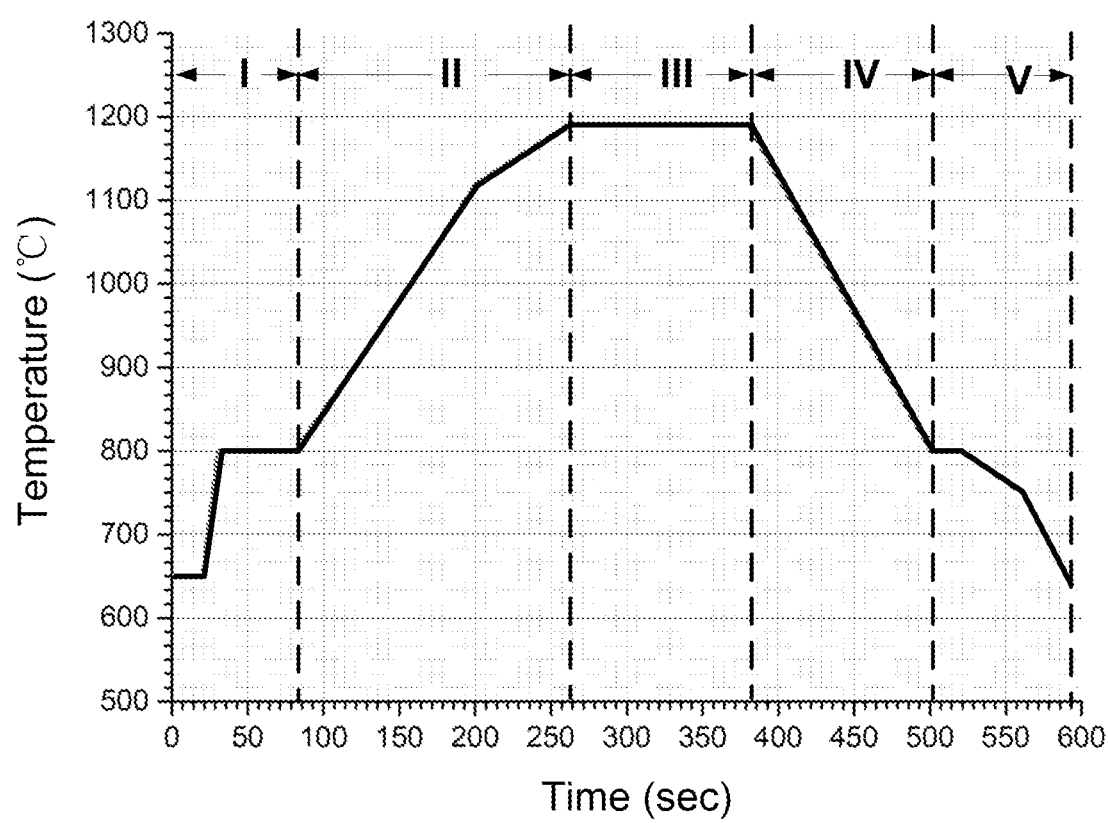
FIG. 3 shows a rinsing procedure according to an embodiment of the invention, presented with a temperature-time plot during isothermal annealing process.

FIG. 3 shows a rinsing procedure in the present embodiment, presented with a temperature-time plot during the isothermal annealing process. As shown in FIG. 3, there are five time periods in the RTA equipment or epitaxy equipment: a first period I, a second period II, a third period III, a fourth period IV, a fifth period V, in order. In the first period I, the SOI structure may enter the equipment at 650° C. for example, stay at 650° C. for seconds, and then the temperature may be linearly raised to 800° C. in which temperature raising speed is no greater than 150° C./min. Then, the SOI structure may stay at 800° C. for several seconds (about 57 sec) to decrease the pressure in the equipment to a target pressure to avoid from generation of sliplines during the next temperature raising process. In the second period II, the temperature may be raised to a target temperature. In the third period III, at the target pressure, annealing process may be performed isothermally. In the fourth period IV, the temperature may be linearly declined to 800° C. at constant pressure to avoid from generation of sliplines. In the fifth period V, the pressure may be isothermally raised to atmosphere pressure, and then the temperature may be declined until the temperature when the SOI structure enters the equipment. Then, the equipment may output the SOI structure. It can be understood that the isothermal annealing process is performed at a low pressure environment, and this can reduce the number of sliplines. Because sliplines are easily generated during the temperature raising process before the annealing process to reach the annealing temperature and the temperature declining process after the annealing process, these processes can be performed at low pressure environment to reduce the number of sliplines effectively.

In the present embodiment, a SOI structure, made with the method mentioned above may be provided.

To sum up, a silicon on insulator and a method of making the same are provided by the present invention. The method may comprise steps of: providing a bonded structure, the bonded structure comprising the first substrate, the second substrate and the insulating buried layer, and the insulating buried layer being positioned between the first substrate and the second substrate; peeling off a layer of removing region of the first substrate from the bonded structure to obtain a SOI structure; and processing the SOI structure with isothermal annealing technology at a pressure which is lower than atmospheric pressure. Through processing with the isothermal annealing technology at the pressure which is lower than atmospheric pressure, the number of sliplines may be reduced effectively without affecting planarization of the top-layer silicon.

Further, the SOI structure may undergo a temperature rising step performed before applying the isothermal annealing technology and a temperature falling step performed after applying the isothermal annealing technology, both of which may be performed at a pressure which is no greater than 100 torr, to reduce the number of sliplines to a greater extent.

Further, please note that terms of "the first," "the second" used here are merely to identify elements, parts, steps, etc., but not intended to present logical relation or order of the elements, parts, steps, unless explanation or specific indication.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method of making a silicon on insulator (SOI) structure, comprising steps of:
    providing a bonded structure, the bonded structure comprising a first substrate, a second substrate and an insulating buried layer, and the insulating buried layer being positioned between the first substrate and the second substrate;
    peeling off a layer of removing region of the first substrate from the bonded structure to obtain the SOI structure; and
    processing the SOI structure with isothermal annealing technology at a pressure which is lower than atmospheric pressure;
    wherein the bonded structure is formed with steps comprises:
    providing the first substrate and the second substrate;
    growing a first oxide layer on a front surface of the first substrate;
    performing ion implantation from the front surface of the first substrate toward the first substrate to obtain a damaged layer;
    bonding the front surface of the first substrate and a front surface of the second substrate to form the bonded structure;
    performing a first annealing for the bonded structure, peeling off the bonded structure along with the damaged layer, and obtain a first film structure constructed on the insulating buried layer, wherein the SOI structure is constructed by the second substrate, the insulating buried layer and the first film structure;
    performing a second annealing for the SOI structure; and
    rinsing a surface of the first film structure.

2. The method according to claim 1, wherein the pressure for the isothermal annealing technology is no greater than 100 torr.

3. The method according to claim 2, further comprising a temperature rising step performed before applying the isothermal annealing technology and a temperature falling step performed after applying the isothermal annealing technology, and both the temperature rising step and the temperature falling step being performed at a pressure which is no greater than 100 torr.

4. The method according to claim 2, wherein a range of an annealing temperature for the isothermal annealing is 1190° C.~1230° C., and annealing time for the isothermal annealing is no greater than 300 sec.

5. The method according to claim 2, wherein an atmosphere for the isothermal annealing technology comprises hydrogen gas, argon gas or mixture of hydrogen gas and argon gas, and gas flow rate is 40 slm~120 slm.

6. The method according to claim 1 wherein when thickness of the insulating buried layer is smaller than 4000 Å, the insulating buried layer comprise a first oxide layer.

7. The method according to claim 1 wherein when thickness of the insulating buried layer is greater than 4000 Å, the insulating buried layer comprise a first oxide layer and a second oxide layer, and during the growth of the first oxide layer on the front surface of the first substrate, the second oxide layer is formed on the front surface of the second substrate.

8. The method according to claim 7, wherein thickness of the first oxide layer is 100 Å~4000 Å, and thickness of the second oxide layer is 100 Å~30000 Å.

9. The method according to claim 1, wherein the second annealing is performed in oxygen-containing atmosphere, and a layer of silicon oxide is grown on the surface of the first film;
    and the rinsing step is used to remove the layer of silicon oxide.

10. A silicon on insulator (SOI) structure, made with the method according to claim 1.

* * * * *